United States Patent
Nakanishi

(10) Patent No.: US 9,978,448 B2
(45) Date of Patent: May 22, 2018

(54) MEMORY CONTROLLER, STORAGE DEVICE, INFORMATION PROCESSING SYSTEM, AND MEMORY CONTROLLING METHOD

(71) Applicant: SONY CORPORATION, Tokyo (JP)

(72) Inventor: Kenichi Nakanishi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 15/520,263

(22) PCT Filed: Oct. 6, 2015

(86) PCT No.: PCT/JP2015/078267
§ 371 (c)(1),
(2) Date: Apr. 19, 2017

(87) PCT Pub. No.: WO2016/067846
PCT Pub. Date: May 6, 2016

(65) Prior Publication Data
US 2017/0316826 A1 Nov. 2, 2017

(30) Foreign Application Priority Data
Oct. 31, 2014 (JP) .................................. 2014-223312

(51) Int. Cl.
*G11C 7/00* (2006.01)
*G11C 13/00* (2006.01)
(Continued)

(52) U.S. Cl.
CPC ............ *G11C 13/0069* (2013.01); *G11C 8/12* (2013.01); *G11C 11/406* (2013.01);
(Continued)

(58) Field of Classification Search
CPC ..... G11C 8/12; G11C 11/406; G11C 13/0069; G11C 13/0033; G11C 13/0035; G11C 2211/4061
(Continued)

(56) References Cited

U.S. PATENT DOCUMENTS 5,774,409 A * 6/1998 Yamazaki ........... G06F 12/0215
365/230.03
6,233,195 B1 * 5/2001 Yamazaki ........... G06F 12/0215
365/230.03
(Continued)

FOREIGN PATENT DOCUMENTS

JP      2005-182909 A   7/2005
JP      2009-099200 A   5/2009
(Continued)

*Primary Examiner* — Gene Auduong
(74) *Attorney, Agent, or Firm* — Chip Law Group

(57) ABSTRACT

To perform refresh without saving data, and prevent corruption of data in non-volatile memories. A number-of-write-operations information holding unit holds number-of-write-operations information, which is the number of write operations of a non-volatile memory to which access is made in units of pages which are divided by a page size. A determination unit determines whether or not refresh, which is reversing of values of all memory cells constituting the pages, is necessary on the basis of the held number-of-write-operations information. A write control unit further performs the refresh in addition to writing when the refresh is necessary on the basis of a result of the determination at a time of the writing with respect to the pages.

11 Claims, 11 Drawing Sheets

(51) Int. Cl.
*G11C 8/12* (2006.01)
*G11C 11/406* (2006.01)

(52) U.S. Cl.
CPC ...... *G11C 13/0033* (2013.01); *G11C 13/0035* (2013.01); *G11C 2211/4061* (2013.01)

(58) Field of Classification Search
USPC ......... 365/222, 203, 185.11, 185.12, 185.24, 365/185.25, 230.06, 230.08
See application file for complete search history.

(56) References Cited

U.S. PATENT DOCUMENTS

| | | | | |
|---|---|---|---|---|
| 7,924,628 B2* | 4/2011 | Danon | ................ | G11C 11/5628 365/185.22 |
| 2009/0132875 A1* | 5/2009 | Kitahara | ............ | G11C 16/3418 714/721 |
| 2010/0211715 A1* | 8/2010 | Huang | .................... | G06F 3/061 710/314 |
| 2014/0059404 A1* | 2/2014 | Okubo | ................ | G06F 11/1016 714/768 |
| 2015/0234749 A1* | 8/2015 | Adachi | ................ | G06F 12/121 711/159 |

FOREIGN PATENT DOCUMENTS

| | | |
|---|---|---|
| JP | 2014-041573 A | 3/2014 |
| WO | 2013/105414 A1 | 7/2013 |

\* cited by examiner

US 9,978,448 B2

MEMORY CONTROLLER, STORAGE DEVICE, INFORMATION PROCESSING SYSTEM, AND MEMORY CONTROLLING METHOD

CROSS REFERENCE TO RELATED APPLICATIONS

This application is a U.S. National Phase of International Patent Application No. PCT/JP2015/078267 filed on Oct. 6, 2015, which claims priority benefit of Japanese Patent Application No. JP 2014-223312 filed in the Japan Patent Office on Oct. 31, 2014. Each of the above-referenced applications is hereby incorporated herein by reference in its entirety.

TECHNICAL FIELD

The present technology relates to a memory controller. Particularly, the technology relates to a memory controller, a storage device, an information processing system, and a memory controlling method which enable data writing on a non-volatile memory.

BACKGROUND ART

Non-volatile memories have been used in storage devices of information processing systems. Such non-volatile memories correspond to electrically erasable and programmable read only memories (EEPROMs), resistance random access memories (ReRAMs), and the like. These non-volatile memories can maintain stored data even when their power is off and thus a power supply is disconnected.

However, a phenomenon of stored data being corrupted in such non-volatile memories is known. ReRAMs, for example, are memories in which resistance values of memory elements inside memory cells are set to be in a high-resistance state or a low-resistance state, and data is stored by associating the state of the resistance values with a logical value. Then, there may be a case in which a resistance value of the memory elements changes as time passes, and thus it is not possible to determine whether they are in the above-described high-resistance state or low-resistance state. In this case, the stored data is eventually corrupted.

As a countermeasure therefor, data stored in memory cells is preserved in a temporary data preserving area to erase the stored data from the memory cells. A storage device which subsequently restores the data preserved in the temporary data preserving area by, i.e., performing refresh, has been proposed (for example, refer to Patent Literature 1).

CITATION LIST

Patent Literature

Patent Literature 1: JP 2005-182909A

DISCLOSURE OF INVENTION

Technical Problem

In the above-described past technology, the number of re-write operations performed in data storage blocks constituted by a plurality of memory cells is counted for each of the blocks. When a counted value reaches a predetermined number of times, the above-described refresh is performed in units of blocks. Thus, there is a problem in that temporary data preserving areas of a size equal to a size of the blocks are necessary, which causes an increase in a size of a memory chip.

The present technology has been created by taking the above circumstance into consideration and aims to perform refresh without performing temporary data preservation and to prevent data in a non-volatile memory from being corrupted.

Solution to Problem

The present technology has been made in order to solve the above problem. A first aspect of the present technology is a memory controller including: a number-of-write-operations information holding unit configured to hold number-of-write-operations information, which is the number of write operations of a non-volatile memory to which access is made in units of pages which are divided by a page size; a determination unit configured to determine whether or not refresh, which is reversing of values of all memory cells constituting the pages, is necessary on the basis of the held number-of-write-operations information; and a write control unit configured to further perform the refresh in addition to writing when the refresh is necessary on the basis of a result of the determination at a time of the writing with respect to the pages. Accordingly, an effect that refresh is performed at the time of writing on the basis of the number-of-write-operations information is exhibited.

In the first aspect, the number-of-write-operations information holding unit may hold the number-of-write-operations information for each of the pages. Accordingly, an effect that the-number-of-write-operations information is held for each of the pages is exhibited.

In the first aspect, the number-of-write-operations information holding unit may hold the number-of-write-operations information for each of blocks, which are constituted by a plurality of pages. Accordingly, an effect that the number-of-write-operations information is held for each of the blocks is exhibited.

In the first aspect, the determination unit may determine that the refresh is necessary when the held number-of-write-operations information is greater than a predetermined threshold value. Accordingly, an effect that the refresh is determined to be necessary when the number of write operations is greater than the predetermined threshold value is exhibited.

In the first aspect, the write control unit may perform the refresh by reading data stored in the pages and writing data obtained by reversing values of bits of the read data on the pages. Accordingly, an effect that the refresh is performed by writing reversed data of the stored data is exhibited.

In the first aspect, the write control unit may perform the refresh by writing first data of a page size of which all bits have the same value and second data obtained by reversing all of the bits of the first data on the pages in order. Accordingly, an effect that the refresh is performed by writing the first data, all of the bits of which have the same value, and the second data obtained by reversing the first data are written in order is exhibited.

In the first aspect, a counter unit configured to perform counting of the number of write operations, update the held number-of-write-operations information with the number of write operations based on the counting when the write control unit performs the writing that does not entail the refresh, and initialize the held number-of-write-operations information when the write control unit performs the writing that entails the refresh may be further included. Accordingly, an effect that the counting of the number of write operations is performed and the updating and initialization of the number-of-write-operations information are performed on the basis of a presence or absence of the refresh by the write control unit is exhibited.

In the first aspect, a cumulative number-of-write-operations information holding unit configured to hold cumulative number-of-write-operations information, which is the cumulative number of write operations of each of the pages; a data replacement control unit configured to control replacement of data in which, on the basis of the held cumulative number-of-write-operations information, data read from one page of a page whose cumulative number of write operations is great and a page whose cumulative number of write operations is small is written on the other page; and a cumulative counter unit configured to perform counting of the cumulative number of write operations, and update the held cumulative number-of-write-operations information with the cumulative number of write operations based on the counting may be further included. The determination unit may further make determination of whether or not the refresh is necessary at a time of the replacement of data. Accordingly, an effect that the refresh is performed at the time of writing for replacement of data is exhibited.

A second aspect of the present technology is a storage device including: a non-volatile memory to which access is made in units of pages which are divided by a page size; a number-of-write-operations information holding unit configured to hold number-of-write-operations information, which is the number of write operations of the non-volatile memory; a determination unit configured to determine whether or not refresh, which is reversing of values of all memory cells constituting the pages, is necessary on the basis of the held number-of-write-operations information; and a write control unit configured to further perform the refresh in addition to writing when the refresh is necessary on the basis of a result of the determination at a time of the writing with respect to the pages. Accordingly, an effect that the refresh is performed at the time of writing on the basis of the number-of-write-operations information is exhibited.

A third aspect of the present technology is an information processing system including: a storage device including a non-volatile memory to which access is made in units of pages which are divided by a page size, a number-of-write-operations information holding unit configured to hold number-of-write-operations information, which is the number of write operations of the non-volatile memory, a determination unit configured to determine whether or not refresh, which is reversing of values of all memory cells constituting the pages, is necessary on the basis of the held number-of-write-operations information, and a write control unit configured to further perform the refresh in addition to writing when the refresh is necessary on the basis of a result of the determination at a time of the writing with respect to the pages; and a host computer which accesses the storage device. Accordingly, an effect that the refresh is performed at the time of writing on the basis of the number-of-write-operations information is exhibited.

A fourth aspect of the present technology is a memory controlling method including: a determination procedure of determining, on the basis of number-of-write-operations information, which is the number of write operations of a non-volatile memory to which access is made in units of pages which are divided by a page size, whether or not refresh, which is reversing of values of all memory cells constituting the pages, is necessary; and a write control procedure of further performing the refresh in addition to writing when the refresh is necessary on the basis of a result of the determination at a time of the writing with respect to the pages. Accordingly, an effect that the refresh is performed at the time of writing on the basis of the number-of-write-operations information is exhibited.

Advantageous Effects of Invention

According to the present technology, an effect that refresh is performed without performing temporary data preservation and data corruption in a non-volatile memory is prevented can be exhibited. Note that effects described herein are not necessarily limitative, and any effect described in the present disclosure may be exhibited.

MODE(S) FOR CARRYING OUT THE INVENTION

Embodiments for implementing the present technology (each of which will be hereinafter referred to as an embodiment) will be described below. Description will be provided in the following order.
1. First embodiment (Example in which refresh is performed by reversing data)
2. Second embodiment (Example in which refresh is performed by setting all bits to "0" and to "1")
3. Third embodiment (Example in which refresh control is performed in memory)
4. Fourth embodiment (Example in which wear leveling is performed)
5. Modified example

[Configuration of Information Processing System]

Figure 1:
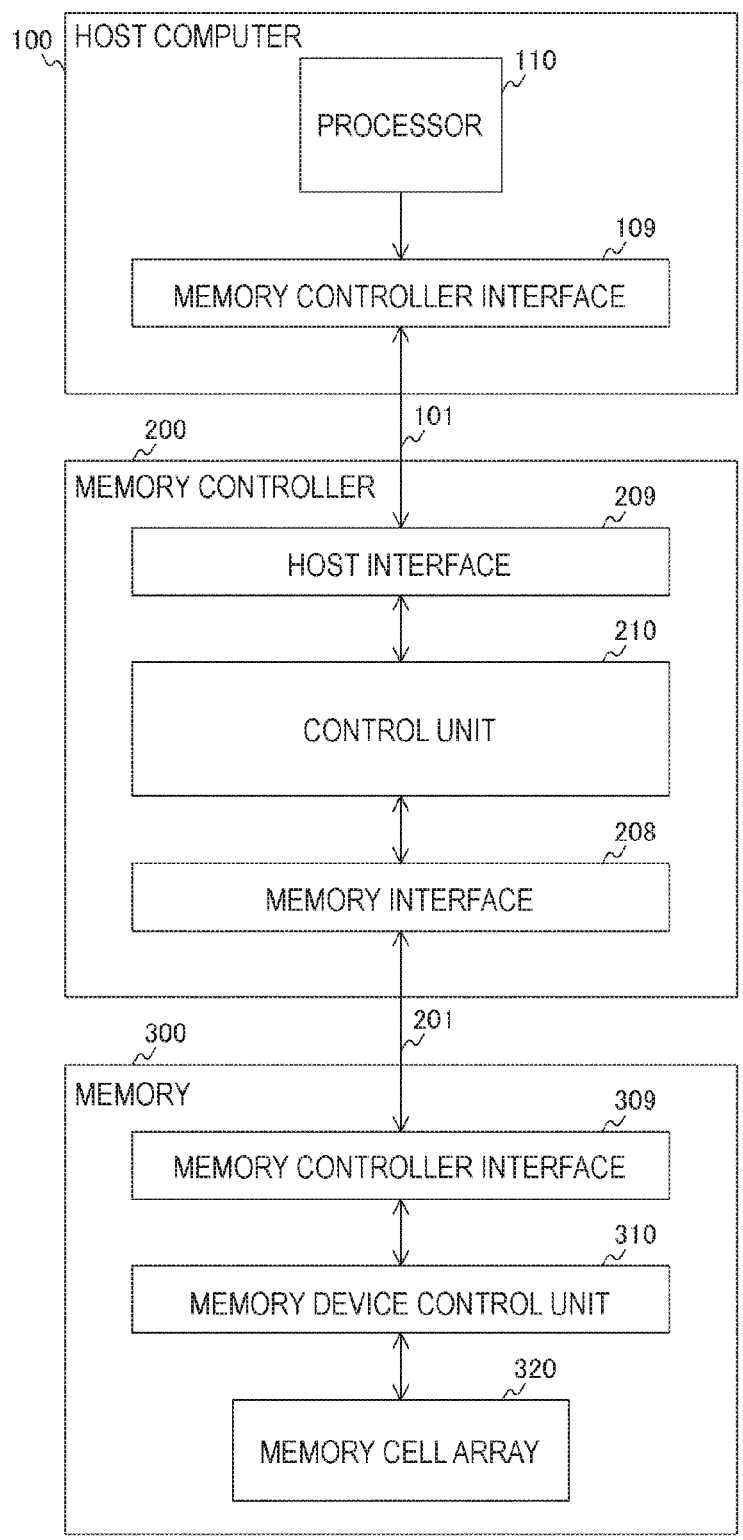
FIG. 1 is a diagram illustrating an example of a configuration of an information processing system according to an embodiment of the present technology.

FIG. 1 is a diagram illustrating an example of a configuration of an information processing system according to an embodiment of the present technology. The information processing system of the diagram includes a host computer 100, a memory controller 200, and a memory 300.

The host computer 100 has a processor 110 and a memory controller interface 109. The host computer 100 performs processes such as image processing. This host computer 100 accesses the memory 300 via the memory controller 200. At that time, the host computer 100 issues commands for writing, reading, and the like to the memory controller 200 to access.

The processor 110 controls the entire host computer 100. The memory controller interface 109 performs an exchange with the memory controller 200.

The memory controller 200 includes a host interface 209, a control unit 210, and a memory interface 208. This memory controller 200 controls the memory 300. In addition, this memory controller 200 interprets commands issued by the host computer 100 and makes write requests or read requests with respect to the memory 300.

The host interface 209 performs an exchange with the host computer 100. The control unit 210 performs control and the like based on the above-described commands. The memory interface 208 performs an exchange with the memory 300.

The memory 300 has a memory controller interface 309, a memory device control unit 310, and a memory cell array 320. This memory 300 stores data necessary for processes of the host computer 100.

The memory controller interface 309 performs an exchange with the memory controller 200. The memory device control unit 310 controls writing and reading with respect to the memory cell array 320 on the basis of the above-described requests. The memory cell array 320 is configured with memory cells arranged two-dimensionally and stores data. This memory cell array 320 is accessed on the basis of page addresses in units of pages that are divided by a page size. Each page has, for example, a size of 2K bites. Note that the memory cell array 320 is assumed to be a ReRAM, which is a non-volatile memory.

[Write and Read Processes in Information Processing System]

When writing is to be performed, the host computer 100 issues a write command, write data corresponding thereto, a write destination page address, and the number of pages to be written to the memory controller 200. The control unit 210 of the memory controller 200 interprets the issued write command and makes a write request with respect to the memory 300 on the basis of the write data corresponding thereto, the write destination page address, and the number of pages to be written. The memory device control unit 310 of the memory 300 performs writing with respect to the memory cell array 320 on the basis of this request.

On the other hand, when reading is to be performed, the host computer 100 issues a read command, a read destination page address accompanied therewith, and the number of pages to be read to the memory controller 200. The control unit 210 of the memory controller 200 interprets this command and makes a read request with respect to the memory 300 on the basis of the read destination page address accompanying the command and the number of pages to be read. The memory device control unit 310 of the memory 300 performs reading from the memory cell array 320 on the basis of this request and outputs read data to the memory controller 200. The control unit 210 of the memory controller 200 outputs this output data to the host computer 100 as read data.

[Configuration of Control Unit of Memory Controller]

Figure 2:
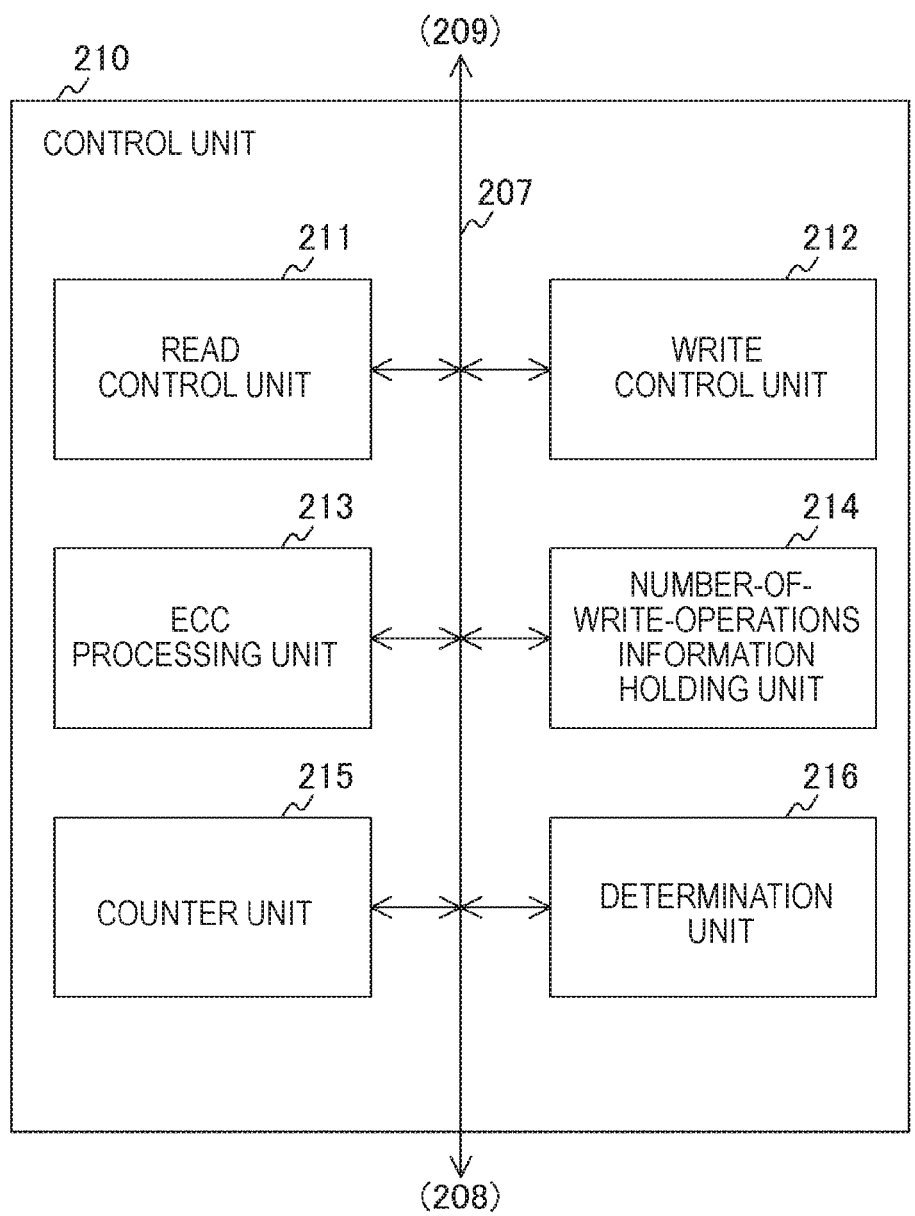
FIG. 2 is a diagram illustrating an example of a configuration of a control unit 210 according to a first embodiment of the present technology.

FIG. 2 is a diagram illustrating an example of a configuration of the control unit 210 according to a first embodiment of the present technology. The control unit 210 has a read control unit 211, a write control unit 212, an ECC processing unit 213, a number-of-write-operations information holding unit 214, a counter unit 215, and a determination unit 216. Note that a bus 207 connects the above-described units of the control unit 210 to each other.

The read control unit 211 performs data reading with respect to the memory 300. This read control unit 211 generates a read request on the basis of a read command issued by the host computer 100 to make a request with respect to the memory 300 to perform reading.

The number-of-write-operations information holding unit 214 holds the number of write operations on the memory 300 as number-of-write-operations information. Here, the number of write operations refers to the number of write operations on each page of the memory cell array 320 of the memory 300. The number-of-write-operations information holding unit 214 holds number-of-write-operations information whose the number is the same as the number of pages of the memory cell array 320. As this number-of-write-operations information holding unit 214, a memory device configured by a non-volatile memory can be used. In addition, as the number-of-write-operations information holding unit 214, a memory device configured by a volatile memory such as an SRAM can be used. In this case, it is necessary to arrange an area within the memory cell array 320 of the memory 300 in which the number-of-write-operations information is saved. In addition, when the information processing system is activated, the memory controller 200 performs an initial operation of reading the number-of-write-operations information from the memory cell array 320 and causing the number-of-write-operations information holding unit 214 to hold the information. Further, when the information processing system is stopped, it is necessary for the memory controller 200 to read the number-of-write-operations information from the number-of-write-operations information holding unit 214 and save the information in the memory cell array 320.

The determination unit 216 determines whether or not refresh is necessary on the basis of the number of write operations held in the number-of-write-operations information holding unit 214. Here, refresh refers to a process of reversing values of all memory cells constituting the pages of the memory cell array 320. Determination of whether or not refresh is necessary can be made on the basis of, for example, whether or not the number of write operations on a page is greater than a predetermined threshold value.

The write control unit 212 performs data writing in the memory 300. In addition, the write control unit 212 further performs refresh in addition to writing when the refresh is necessary on the basis of a result of determination of the determination unit 216 when writing is performed. The write control unit 212 generates a write request on the basis of a write command issued by the host computer 100, and performs writing by making a request with respect to the memory 300. When the refresh is to be further performed in addition to this writing, the write control unit 212 makes a refresh writing request to be described below with respect to the memory 300 instead of a write request. On the basis of these requests, writing and refresh are performed with respect to the memory 300.

The counter unit 215 counts the number of write operations and performs updating and initialization of the number-of-write-operations information held in the number-of-write-operations information holding unit 214. When writing without refresh is performed by the write control unit 212, the counter unit 215 performs counting of the number of write operations and updating of the number-of-write-operations information. This counting of the number of write operations can be performed in, for example, the following procedure. First, the counter unit 215 reads the number of write operations corresponding to a page on which writing has been performed from the number-of-write-operations information holding unit 214. Next, counting is performed by adding the value "1" to the read number of write operations. The number of write operations based on this counting is held in the number-of-write-operations information holding unit 214 as new number-of-write-operations information. In this way, the number-of-write-operations information is updated.

On the other hand, when the refresh has been performed by the write control unit 212 in addition to writing, the counter unit 215 initializes the number-of-write-operations information. This initialization of the number-of-write-operations information can be performed by, for example, causing the number-of-write-operations information holding unit 214 to hold the value "0" as new number-of-write-operations information.

The ECC processing unit 213 performs encoding, in which parity is added to write data output from the host computer 100 to turn the data into ECC codes, and decoding to take out original data from ECC codes. During this decoding, errors of the data are corrected. When writing is to be performed in the memory 300, the write control unit 212 causes the ECC processing unit 213 to perform ECC encoding on write data accompanied with a write command. The write control unit 212 generates a request for setting the ECC-encoded write data as new write data and submits the request to the memory 300. In addition, when reading from the memory 300 is to be performed, the read control unit 211 causes the ECC processing unit 213 to perform decoding and error correction on data output from the memory 300 on the basis of a read request. Thereafter, the data that has undergone decoding and error correction is output to the host computer 100 as read data.

Note that each of the blocks included in the memory controller 200 such as the read control unit 211 and the like may employ any form as long as the blocks are configured as dedicated hardware and their functions are realized by software.

[Configuration of Memory Cells]

Figure 3:
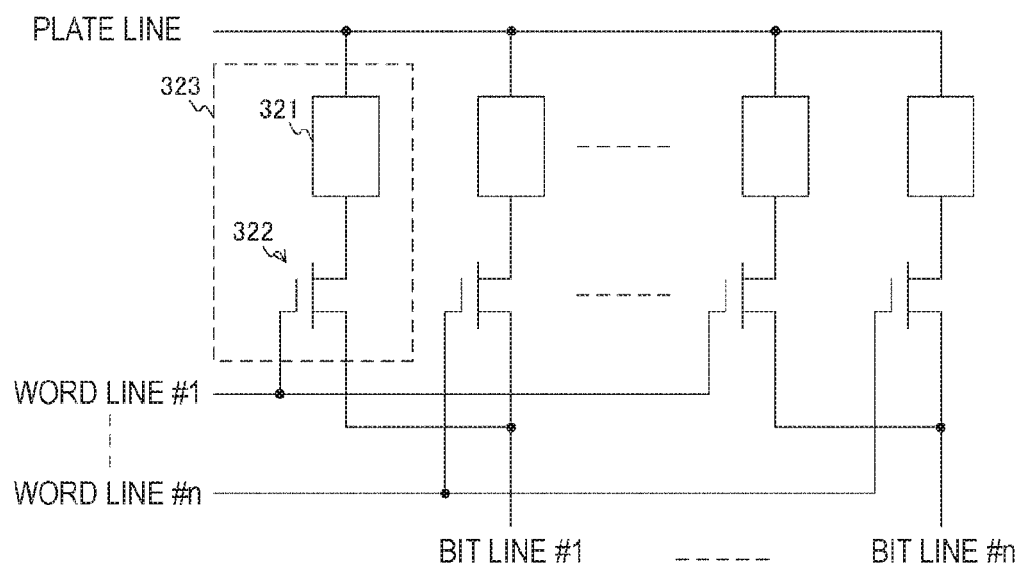
FIG. 3 is a diagram illustrating an example of a configuration of memory cells according to the first embodiment of the present technology.

FIG. 3 is a diagram illustrating an example of a configuration of memory cells according to the first embodiment of the present technology. The diagram shows a configuration of the memory cells of the ReRAM, which is the memory cell array 320. As shown in the diagram, a 1-bit memory cell 323 is constituted by a memory element 321 and a MOSFET 322. Note that the MOSFET 322 is a transistor that drives the memory element 321. One end of the memory element 321 is connected to a plate line, which is a common signal line, and the other end of the memory element 321 is connected to a drain terminal of the MOSFET 322. A gate terminal of the MOSFET 322 is connected to one of a plurality of word lines, and a source terminal thereof is connected to one of a plurality of bit lines. The word lines and bit lines are wired with respect to the MOSFET 322 constituting the memory cell 323 in an XY matrix shape. Accordingly, by selecting one from each of the word lines and the bit lines and inputting a signal thereto, one memory cell 323 is selected and data writing or reading is performed thereon. For example, a word line #1 and a bit line #1 are selected when the memory cell 323 described at the left end of the diagram is selected.

The memory element 321 is an element in which data is stored. This memory element 321 has a resistance value that changes depending on a polarity of a voltage applied thereto. For example, with respect to a terminal of the memory element 321 that is connected to the plate line, the memory element 321 can be set to be in a high-resistance state by applying a voltage (a write voltage) having a positive polarity to the other terminal of the memory element 321. Conversely, the memory element 321 can be set to be in a low-resistance state by applying a write voltage having a negative polarity to the other terminal of the memory element 321. Note that the high-resistance state will be referred to as an HRS and the low-resistance state will be referred to as an LRS below. Data is stored by associating these two states with logical values. For example, the value "0" can be set for the memory element 321 in the LRS, and the value "1" can be set for the memory element 321 in the HRS. In addition, the two states of the LRS and HRS of the memory element 321 are maintained even without power being supplied.

A writing method with respect to the memory cell 323 will be described exemplifying the memory cell 323 at the left end of the diagram. When the value "1" is to be written in the memory cell 323, an on-voltage is applied to the word line #1 to set the MOSFET 322 to be in an on state, and a write voltage having the positive polarity with respect to the plate line is applied to the bit line #1. Accordingly, the memory element 321 is in the FIRS and the value "1" is written therein. On the other hand, when the value "0" is to be written in the memory cell 323, the on-voltage is applied to the word line #1 and a voltage having the negative polarity with respect to the plate line is applied to the bit line #1. Accordingly, the memory element 321 is in the LRS and the value "0" is written therein. Writing can be performed with respect to the memory cell 323 as described above.

Note that the above-described writing is simultaneously performed with respect to a plurality of memory cells 323. For example, the on-voltage is applied to the word line #1 and a voltage having a polarity corresponding to write data is applied to bit lines #1 to #n. Accordingly, writing can be performed with respect to n memory cells 323 that are connected to the word line #1. The number of memory cells 323 in which writing can be performed through one write process corresponds to the above-described page size.

Note that data reading with respect to the memory cell 323 is performed by measuring a current flowing after a lower voltage than a write voltage is applied to the memory element 321 and then determining the LRS or the HRS.

There is a term of validity with respect to writing in the memory element 321. That is, if writing is repeated, the memory element 321 reaches a corruption level thereof. Thus, it is necessary to reduce unnecessary writing, and thus the following write process is performed in the ReRAM. First, pre-reading, which is reading of data stored in the memory cell, is performed before writing. Writing is performed with respect to the memory cell only when write data is different from the data obtained from the pre-reading (hereinafter referred to as pre-read data). Due to this write process, it is possible to prevent unnecessary writing and avoid early corruption of the memory element 321 caused by writing.

Meanwhile, the resistance value of the memory element 321 changes as time passes. For example, the resistance value of the memory element 321 which has been set to be in the FIRS as a result of writing the value "1" therein is lowered with an elapse of time and then changes to a value approximately equal to a threshold value for determining the LRS or HRS. If data reading is performed in such a case, there is a concern that it is not possible to perform normal reading of data written in advance. In ReRAMs, corruption of stored data attributable to an elapse of time occurs separately from corruption of the memory element 321 described above. In order to prevent such an occurrence, it is necessary to write stored data again to re-write the data. However, since writing is performed with respect to only bits of write data and pre-read data that are different from each other as described above, even if data stored in memory cells is written again, data re-writing is not performed. Thus, it is necessary to perform the refresh, which is a process of reversing values stored in the memory cells.

It is necessary to execute the refresh before a time that is taken to cause corruption of data elapses after writing the data. However, there may be a state in which the memory cells have different times that have elapsed after writing even though the memory cells belong to the same page. The reason for this is that writing is performed for only bits of write data and pre-read data that are different from each other. For example, when writing is performed m times on a page, the number of write operations on bits varies in a range from 0 to m. The number of write operations for each page is fixed to prevent corruption of stored data in the memory element 321 in the above-described case, and the refresh is performed on that page when the number of write operations exceeds a predetermined threshold value. The threshold value should be set on the basis of the time taken to cause corruption of data on the assumption that the data has not been re-written on the memory cells of the page even once. In order to perform the refresh, the memory controller 200 makes a refresh writing request with respect to the memory 300.

[Method of Writing]

Figure 4:
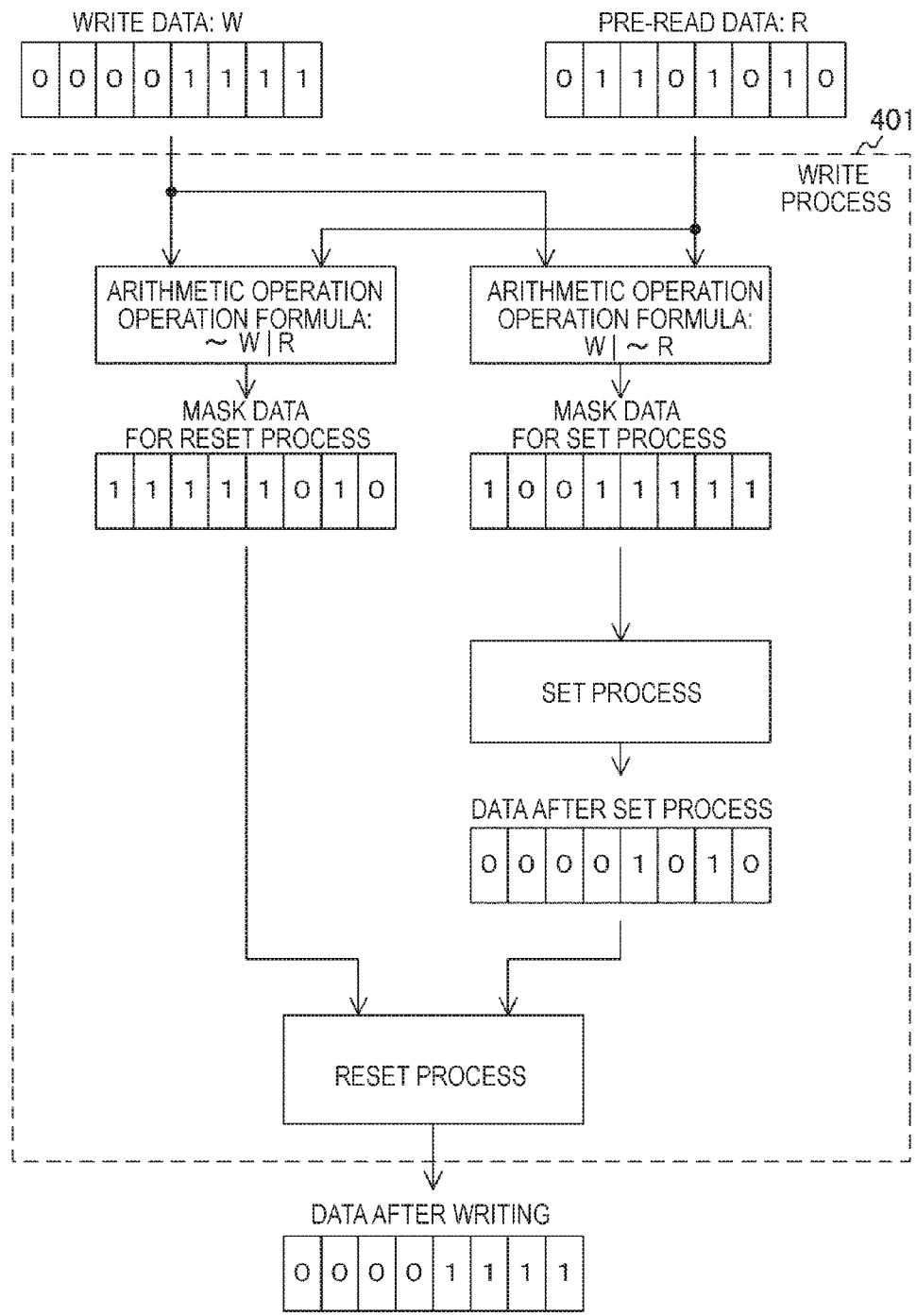
FIG. 4 is a diagram illustrating data writing according to the first embodiment of the present technology.

FIG. 4 is a diagram illustrating data writing according to the first embodiment of the present technology. The diagram shows a write process 401 that is a write process performed by the memory device control unit 310. The memory device control unit 310 executes the write process 401 on the basis of a write request from the memory controller 200. For the sake of convenience, a page size is assumed to be 8 bits. Note that, in the diagram, write data is denoted by W, and pre-read data is denoted by R. The write process 401 can be performed through a set process and a reset process. Here, the set process is a process of changing values of write target bits from "1" to "0." In addition, the reset process is a process of changing the values of the write target bits from "0" to "1." Both of the processes are performed on the basis of mask data. This mask data has the same size as the page size and serves as data for specifying positions of bits that are subject to the set process or the reset process on the page. In the diagram, either the set process or the reset process is performed on bits of a page corresponding to bits of the value "0" of the mask data, and neither of the processes are performed on bits of a page corresponding to bits of the value "1" of the mask data.

First, mask data for a set process and mask data for a reset process are generated from write data and pre-read data. The mask data for a set process can be computed by performing an OR operation of each bit with respect to a result of a NOT operation of each bit of the pre-read data and the write data. To express the computation with a logical formula, the following operation formula is obtained.

$$SData = W | {\sim} R$$

Here, SData indicates the mask data for a set process. | and ~ are operators respectively indicating an OR operation of each bit and a NOT operation of each bit. In addition, the mask data for a reset process can be computed by performing an OR operation of each bit with respect to a result of a NOT operation of each bit of the write data and the pre-read data. To express the computation with a logical formula, the following operation formula is obtained.

$$RData = {\sim}W | R$$

Here, RData indicates the mask data for a reset process.

After the creation of the mask data, a set process and a reset process are performed in order. Accordingly, the write process 401 can be executed.

[Method of Refresh Writing]

Figure 5:
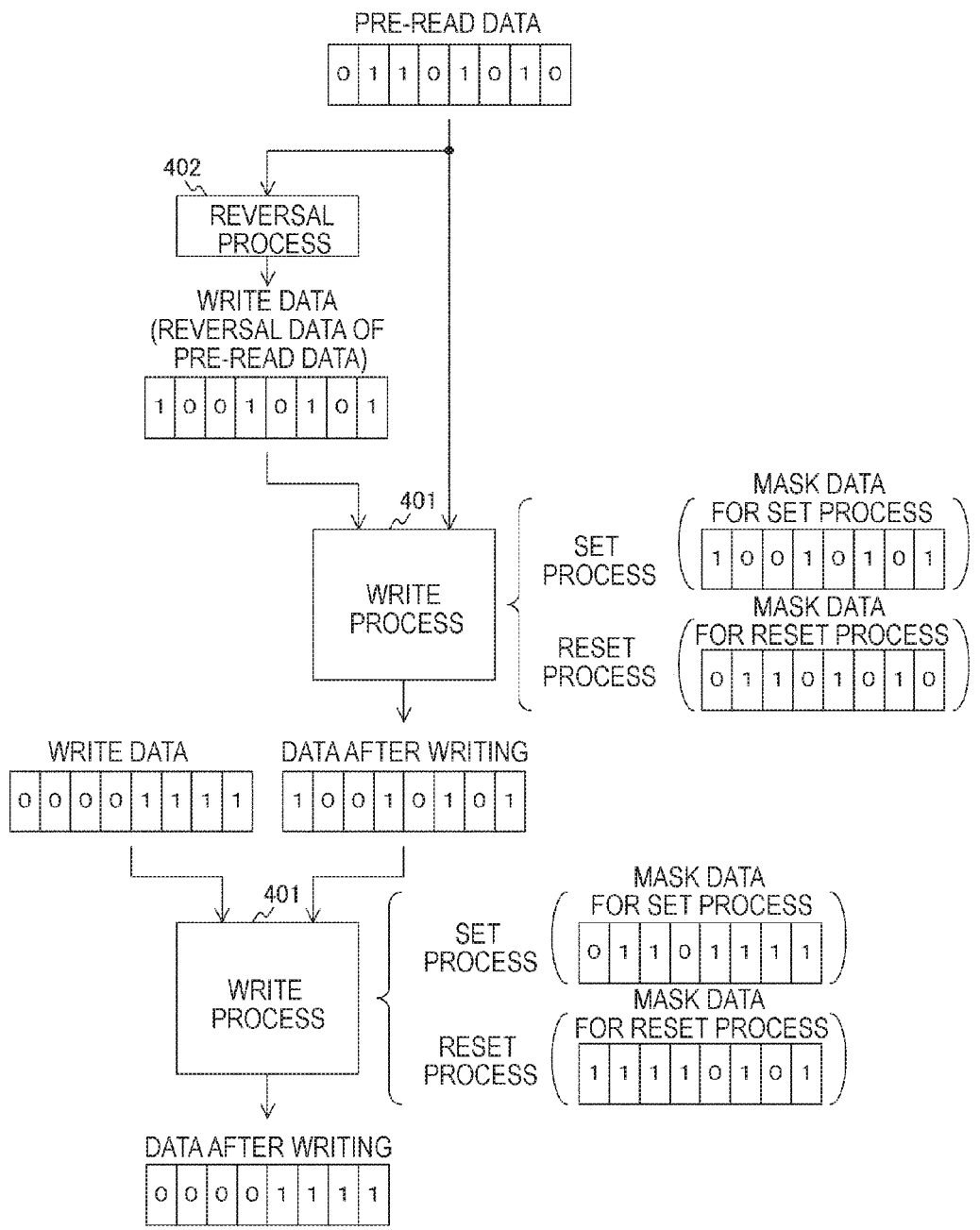
FIG. 5 is a diagram illustrating refresh writing according to the first embodiment of the present technology.

FIG. 5 is a diagram illustrating refresh writing according to the first embodiment of the present technology. The diagram shows a process of refresh writing performed by the memory device control unit 310. The refresh writing of the diagram is constituted by a reversal process 402 to be described below and two write processes 401. Among these processes, the reversal process 402 and the first write process 401 correspond to a refresh process.

The processes of the diagram will be described. First, the memory device control unit 310 acquires pre-read data by performing pre-reading. Next, the memory device control unit 310 executes the reversal process 402 with respect to this pre-read data. This is executed by performing a NOT operation on each bit of the acquired pre-read data. Next, the memory device control unit 310 executes the write process 401 to convert the pre-read data that has undergone the reversal process into write data. Accordingly, data of all memory cells of a page can be reversed. Next, the memory device control unit 310 executes the second write process 401 with respect to the memory cells whose data has been reversed. Accordingly, desired data can be written. Note that mask data for a set process and a reset process generated in these write process 401 is indicated in the diagram.

The embodiment of the present technology employs a mode in which refresh is performed along with writing as described above. On the other hand, in a mode in which refresh is performed separately from writing, a procedure in which data for refresh is read and saving and writing-back the read data are performed is necessary. For this reason, a temporary storage area for saving data is necessary. In addition, after writing data that is obtained by reversing the pre-read data for refresh, the original data has to be written again, which causes an increased number of write operations in comparison to the embodiment of the present technology.

[Write Process]

Figure 6:
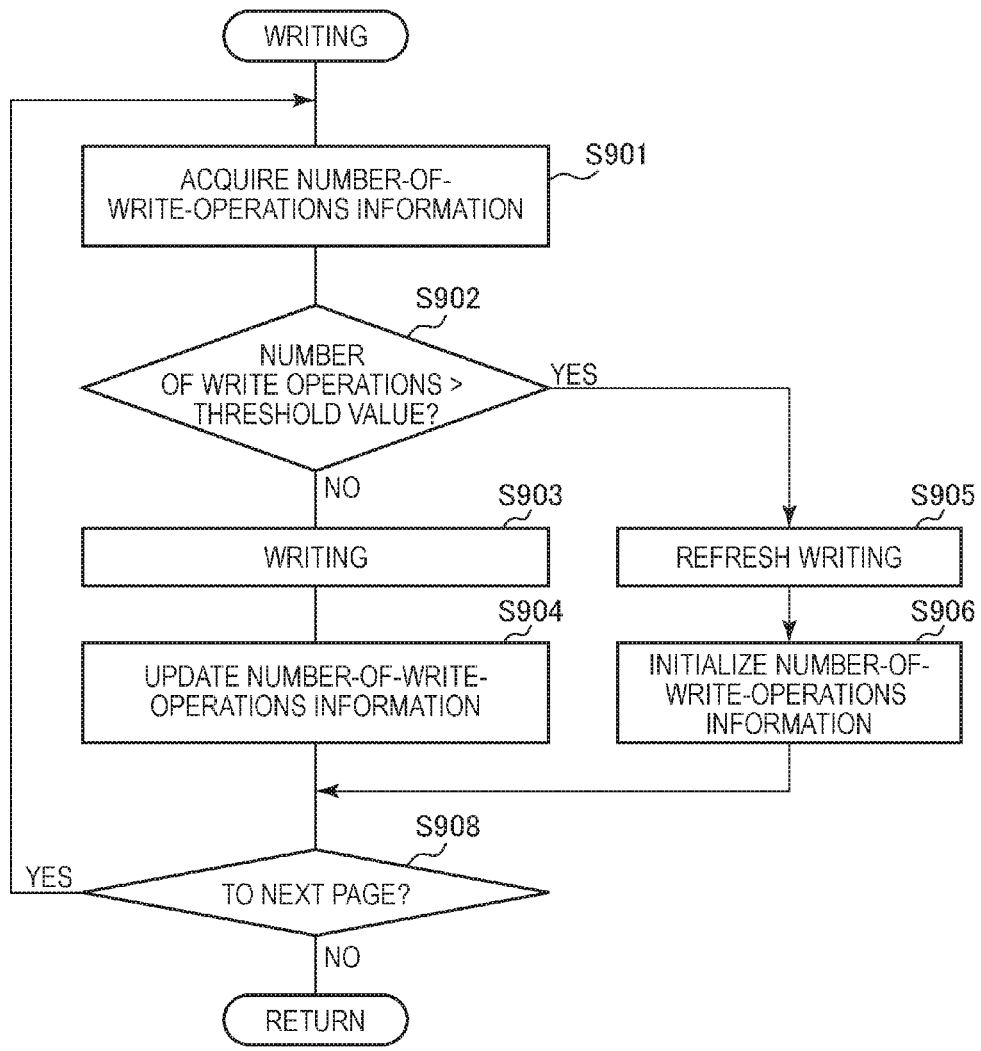
FIG. 6 is a diagram illustrating an example of a procedure of a write process according to the first embodiment of the present technology.

FIG. 6 is a diagram illustrating an example of a procedure of a write process according to the first embodiment of the present technology. When a write command is issued by a host computer, the memory controller 200 starts this process. First, the memory controller 200 acquires number-of-write-operations information of a page set as a write target (Step S901). Next, the memory controller 200 determines whether or not the number of write operations is greater than a predetermined threshold value on the basis of the acquired number-of-write-operations information (Step S902). When the number of write operations is not greater than the threshold value as a result (No in Step S902), the memory controller 200 makes a write request with respect to the memory 300 and then performs writing (Step S903). Next, the memory controller 200 increments the number of write operations, causes the number-of-write-operations information holding unit 214 to hold the results as new write information, and thereby updates write information (Step S904). Thereafter, the process proceeds to the process of Step S908.

On the other hand, when the number of write operations is greater than the threshold value (Yes in Step S902), the memory controller 200 makes a refresh writing request with respect to the memory 300, and then performs refresh writing (Step S905). Next, the memory controller 200 causes the number-of-write-operations information holding unit to hold number-of-write-operations information having the value "0," and thereby initializes the write information (Step S906), and then proceeds to the process of Step S908. In Step S908, the memory controller 200 determines whether or not the write process has been completed for all pages (Step S908). As a result, when the write process has been completed for all of the pages (No in Step S908), the memory controller 200 ends the write process. On the other hand, when there remains a page on which writing is to be performed next (Yes in Step S908), the memory controller 200 executes the process from Step S901 again.

According to the first embodiment of the present technology described above, by determining whether or not refresh is necessary on the basis of the number of write operations of each page and performing the refresh, values of all memory cells constituting pages are reversed, and thus corruption of data of the memory cells can be prevented. In addition, since this refresh is performed along with the write process, it is unnecessary to save data stored in the memory cells at a time of the refresh, and thus the temporary storage device for saving data can be deleted.

<2. Second Embodiment>

In the above-described first embodiment, refresh is performed by reversing data of memory cells. On the other hand, in a second embodiment of the present technology, the refresh is performed by writing data of all bits of "0" and all bits of "1" in memory cells in order. Thereby, a refresh process can be simplified.

[Refresh Writing Method]

Figure 7:
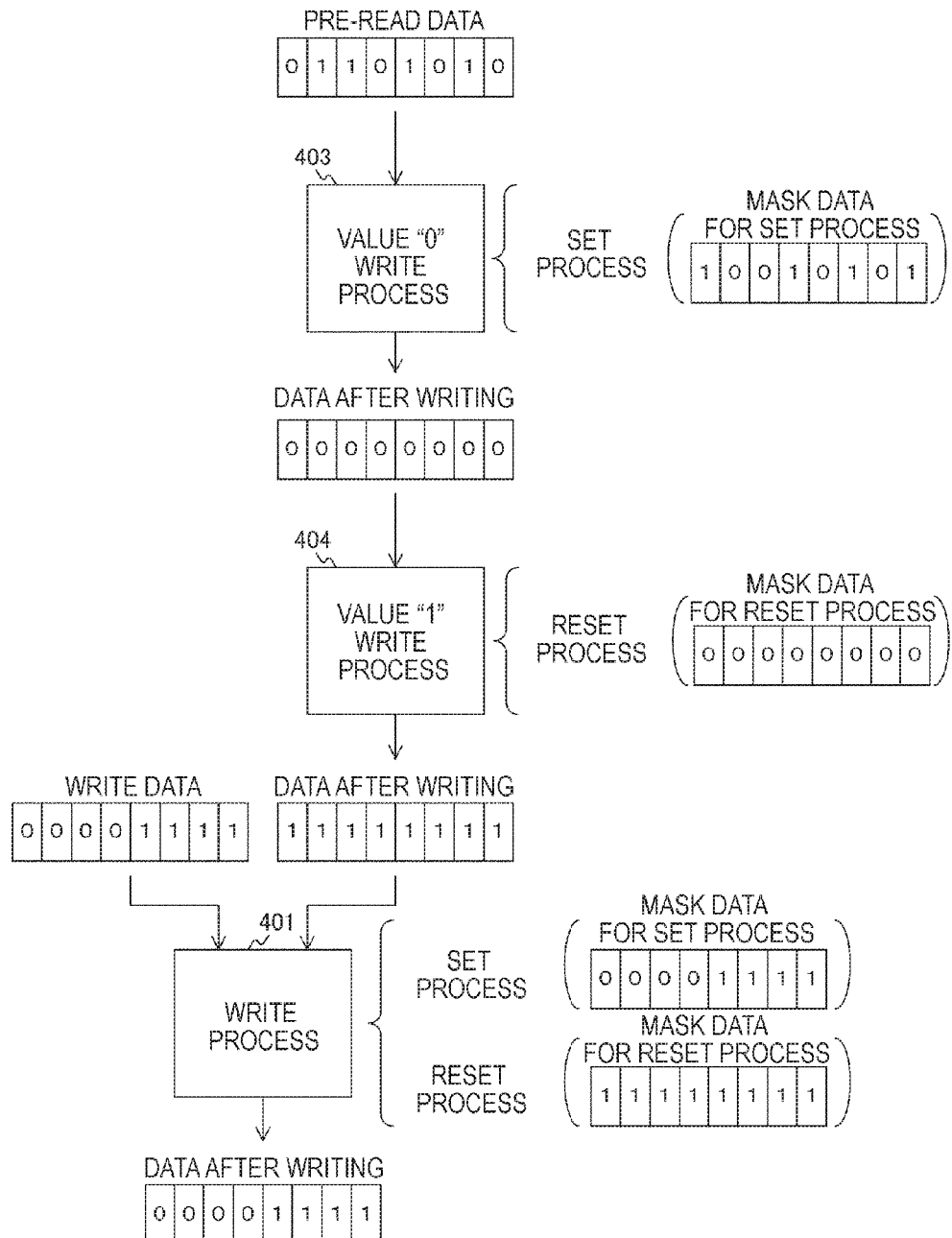
FIG. 7 is a diagram illustrating refresh writing according to a second embodiment of the present technology.

FIG. 7 is a diagram illustrating refresh writing according to the second embodiment of the present technology. The refresh writing of the diagram is constituted by a value "0" write process 403 in which the value "0" is written in all bits of memory cells and a value "1" write process 404 in which the value "1" is written in all of the bits of the memory cells, and a write process 401. Among these processes, the value "0" write process 403 and the value "1" write process 404 correspond to the refresh process according to the second embodiment of the present technology. The processes of the diagram will be described. First, a memory device control unit 310 acquires pre-read data by performing pre-reading. Next, the memory device control unit 310 executes the value "0" write process 403. This is executed by generating mask data for a set process by reversing the pre-read data and then performing the set process using the data. Accordingly, the value "0" is written in all of the bits of the memory cells.

Next, the memory device control unit 310 executes the value "1" write process 404. This is executed by performing a reset process using mask data for a reset process of which all bits are the value "0." Accordingly, the value "1" is written in all of the bits of the memory cells. Next, the memory device control unit 310 executes the write process 401 with respect to the memory cells in which the value "1" is written for all of the bits. Accordingly, desired data can be written. Note that mask data for a set process and a reset process generated in the write processes is shown in the diagram. Generation of the mask data is relatively easy, and thus it is possible to make a process simpler in comparison to the case of the refresh writing request described in FIG. 5. In addition, the reset process may be omitted in the write process 401 of FIG. 7. In that case, it can be an even simpler process.

Configurations of a memory controller 200 and a memory 300 other than those described above are similar to those of the memory controller 200 and the memory 300 described in the first embodiment of the present technology, and thus description thereof is omitted.

According to the second embodiment of the present technology described above, generation of mask data for refresh can be simplified, and thus the refresh can be performed through a simpler process.

<3. Third Embodiment>

In the first embodiment described above, the memory controller 200 controls the refresh. On the other hand, in a third embodiment of the present technology, a memory 300 controls the refresh. Accordingly, processes of a memory controller 200 can be simplified.

[Configuration of Memory]

Figure 8:
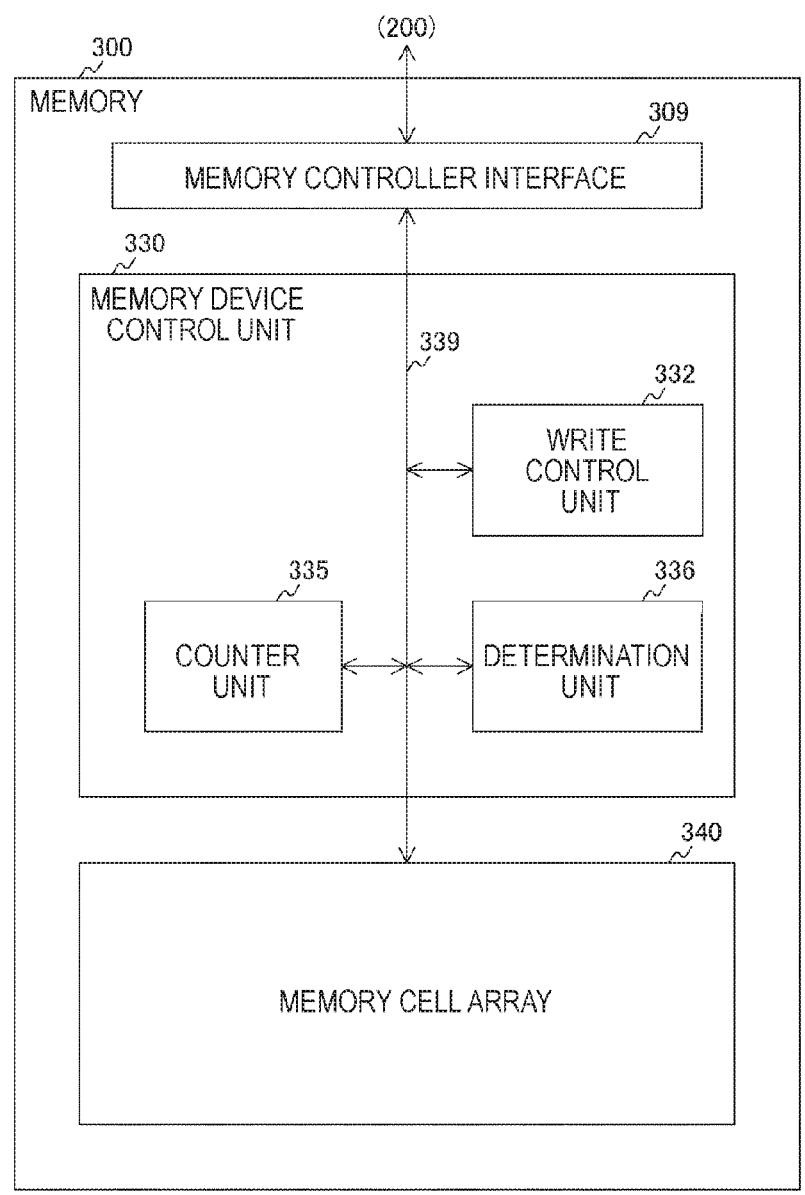
FIG. 8 is a diagram illustrating an example of a configuration of a memory 300 according to a third embodiment of the present technology.

FIG. 8 is a diagram illustrating an example of a configuration of the memory 300 according to the third embodiment of the present technology. The memory 300 is different from the memory 300 described in FIG. 1 in that the memory device control unit 310 and the memory cell array 320 are changed respectively to a memory device control unit 330 and a memory cell array 340.

The memory device control unit 330 has a write control unit 332, a counter unit 335, and a determination unit 336. Note that a bus 339 connects the units of the memory device control unit 330 to each other.

The determination unit 336 determines whether or not the above-described refresh is necessary on the basis of the number of write operations held in the memory cell array 340.

The write control unit 332 performs data writing with respect to the memory cell array 340 on the basis of a write request made by the memory controller 200. In addition, this write control unit 332 performs refresh writing when refresh is necessary on the basis of a result of a determination of the determination unit 336 at a time of writing. Such writing and refresh writing with respect to the memory cell array 340 can be performed through the write process and the refresh writing process described in FIGS. 4 and 5.

The counter unit 335 counts the number of write operations, and updates the number-of-write-operations information held in the memory cell array 340, which will be described below, with the counted number of write operations.

[Configuration of Memory Cell Array]

Figure 9:
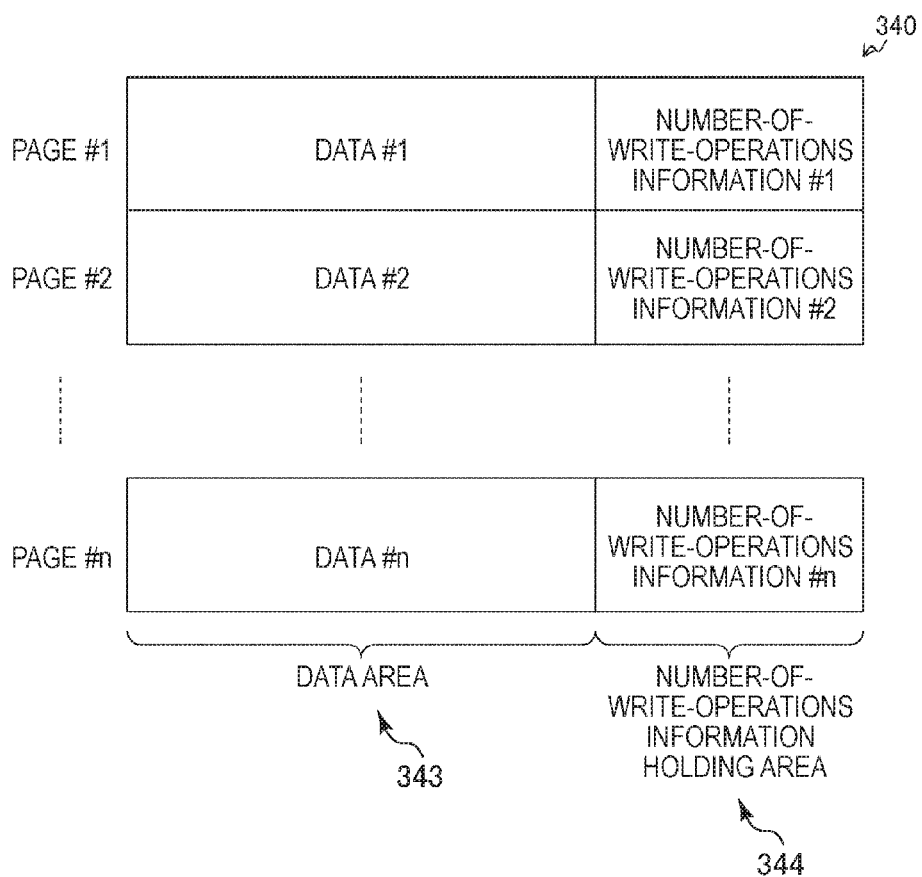
FIG. 9 is a diagram illustrating an example of a configuration of a memory cell array 340 according to the third embodiment of the present technology.

FIG. 9 is a diagram illustrating an example of a configuration of the memory cell array 340 according to the third embodiment of the present technology. The diagram schematically shows the configuration of the memory cell array 340, and the memory cell array 340 has data areas 343 in which data is held and number-of-write-operations information holding areas 344 in which number-of-write-operations information is held for each page.

Note that, since configurations of the memory controller 200 and the memory 300 other than those described above are similar to the memory controller 200 and the memory 300 described in the first embodiment of the present technology, description thereof will be omitted. Note that the number-of-write-operations information holding areas 344 are examples of the number-of-write-operations information holding unit described in the claims.

Data writing in a system that has such a memory 300 will be described. When a write command is issued by a host computer 100, the memory controller 200 makes a write request with respect to the memory 300 based on the command. The memory device control unit 330 of the memory 300 performs data writing with respect to the memory cell array 340 on the basis of the received request. At this time, whether or not a refresh is necessary for a target page is determined, and when the refresh is necessary, refresh writing is performed. Accordingly, the memory controller 200 can perform a write process without intervening in a refresh process.

According to the third embodiment of the present technology described above, the memory 300 controls the refresh. Thus, a process for the refresh by the memory controller 200 can be omitted, and therefore processes of the memory controller 200 can be simplified.

<4. Fourth Embodiment>

In the first embodiment described above, a system with a storage device constituted by a non-volatile memory is assumed. On the other hand, in a fourth embodiment of the present technology, a system in which such a storage device has a wear leveling function is assumed. Thus, a refresh process can also be performed in the system having a wear leveling function, and corruption of data in memory cells can be prevented.

[Wear Leveling Process]

A wear leveling process is a process of leveling the number of write operations for each page, which is a unit of access. There is a term of validity with respect to writing in a ReRAM as described above. When data having a high frequency of re-writing is saved in a specific page, the page has an increased number of write operations compared to other pages. Thus, memory elements of memory cells of the page are corrupted within a shorter period of time compared to other pages, and saved data is lost. In order to prevent this and improve reliability of a system, the numbers of times of writing of pages are leveled to prevent data having a high frequency of re-writing from being unevenly saved in a specific page. Specifically, on the basis of a cumulative number of write operations, which is the cumulative number of write operations of each page, replacement of data stored in pages is performed between a page having the greatest cumulative number of write operations and a page having the smallest cumulative number of write operations. This replacement of data can be performed by writing data read from one page into the other page, which is a target page.

[System Configuration]

Figure 10:
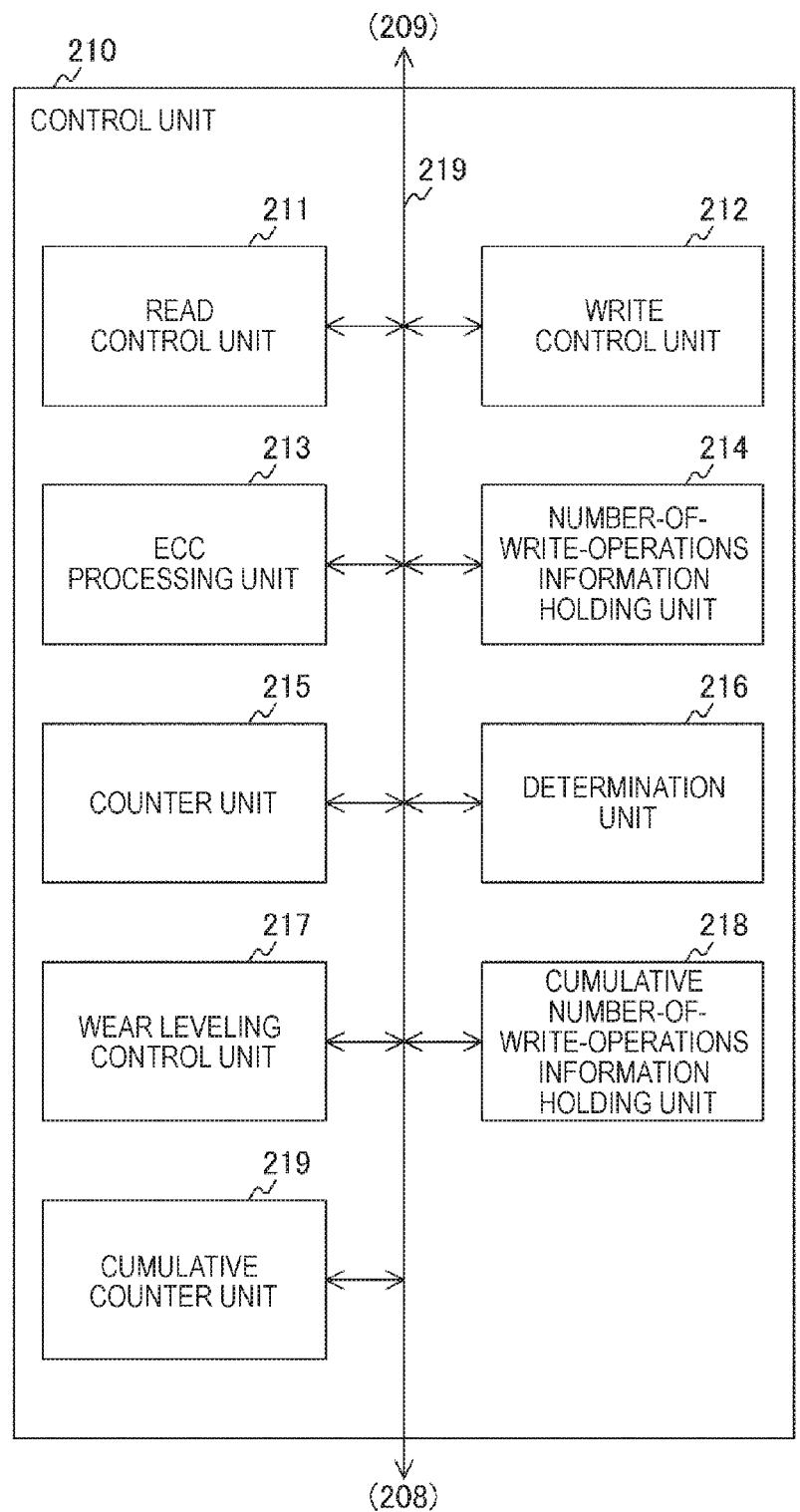
FIG. 10 is a diagram illustrating an example of a configuration of a control unit 210 according to a fourth embodiment of the present technology.

FIG. 10 is a diagram illustrating an example of a configuration of a control unit 210 according to the fourth embodiment of the present technology. The control unit 210 of the diagram is different from the control unit 210 described with reference to FIG. 2 in that a wear leveling control unit 217, a cumulative number-of-write-operations information holding unit 218, and a cumulative counter unit 219 are further provided. Configurations of a memory controller 200 and a memory 300 other than the above units are similar to the memory controller 200 and the memory 300 described in the first embodiment of the present technology, and thus descriptions thereof are omitted.

The cumulative number-of-write-operations information holding unit 218 holds cumulative number-of-write-operations information of each page.

The cumulative counter unit 219 counts a cumulative number of write operations. In addition, this cumulative counter unit 219 also updates cumulative number-of-write-operations information held in the cumulative number-of-write-operations information holding unit 218 with the counted cumulative number of write operations. The counting by this cumulative counter unit 219 is performed when the write control unit 212 performs writing, and can be performed in, for example, the following procedure. First, the cumulative counter unit 219 reads a cumulative number of write operations corresponding to a page in which writing has been performed from the cumulative number-of-write-operations information holding unit 218. Next, counting is performed by adding the value "1" to the read cumulative number of write operations. The cumulative number of write operations based on this counting is held in the cumulative number-of-write-operations information holding unit 218 as new cumulative number-of-write-operations information. Accordingly, the cumulative number-of-write-operations information is updated.

The wear leveling control unit 217 performs the wear leveling process with respect to the memory 300. This wear leveling process can be performed as follows. First, the wear leveling control unit 217 reads cumulative number-of-write-operations information from the cumulative number-of-write-operations information holding unit 218, compares the information to the cumulative number of write operations of each page, and then extracts each of pages having the greatest and the smallest cumulative numbers of times of writing. Next, the wear leveling control unit 217 causes the read control unit 211 to read data from these pages. Next, the wear leveling control unit 217 replaces the read data and writes the data on a target page. This writing is performed by the write control unit 212. Accordingly, wear leveling can be performed. Note that the wear leveling control unit 217 is an example of the replacement control unit described in the claims.

The determination unit 216 also determines whether or not refresh is necessary on the basis of the number of write operations held in the number-of-write-operations information holding unit 214 at a time of replacement of data.

The write control unit 212 further performs refresh in addition to writing when the refresh is necessary on the basis of the result of the determination of the determination unit 216 at a time of writing for the replacement of data.

The counter unit 215 counts the number of write operations even when writing has been performed for the replacement of data, and updates or initializes number-of-write-operations information held in the number-of-write-operations information holding unit 214.

[Write Process]

Figure 11:
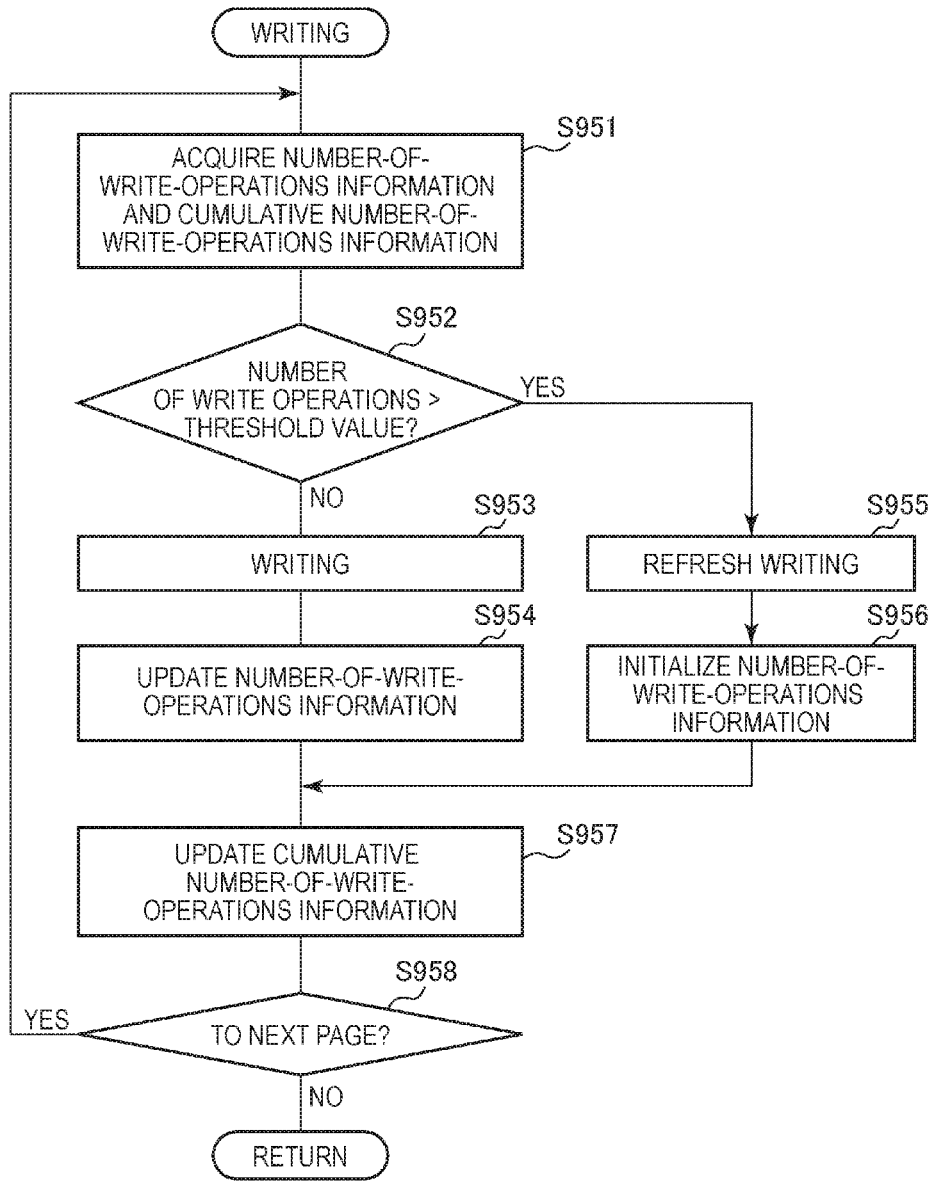
FIG. 11 is a diagram illustrating an example of a procedure of a write process according to the fourth embodiment of the present technology.

FIG. 11 is a diagram illustrating an example of a procedure of a write process according to the fourth embodiment of the present technology. When a write command is issued from a host computer, the memory controller 200 starts the process. First, the memory controller 200 acquires number-of-write-operations information and cumulative number-of-write-operations information of a page which is a writing target (Step S951). Next, the memory controller 200 determines whether or not the number of write operations is greater than a predetermined threshold value (Step S952). When the number of write operations is not greater than the threshold value as a result (No in Step S952), the memory controller 200 makes a write request with respect to the memory 300 and performs writing (Step S953). Thereafter, the memory controller 200 updates the number-of-write-operations information (Step S954) and proceeds to the process of Step S957.

On the other hand, when the number of write operations is greater than the threshold value (Yes in Step S952), the memory controller 200 makes a refresh writing request with respect to the memory 300 and performs refresh writing (Step S955). Thereafter, the memory controller 200 initializes the number-of-write-operations information (Step S956) and then proceeds to the process of Step S957. In Step S957, the memory controller 200 updates the cumulative number-of-write-operations information (Step S657). Next, the memory controller 200 determines whether or not the write process has been completed for all pages (Step S958). When the write process has been completed for all of the pages as a result (No in Step S958), the memory controller 200 ends the write process. On the other hand, when there is a remaining page on which writing is to be performed (Yes in Step S958), the memory controller 200 executes the process from Step S951 again.

According to the fourth embodiment of the present technology described above, corruption of data of memory cells can also be prevented in a system having the wear leveling function by performing refresh for writing accompanied with the wear leveling process.

<Modified Example>

[First Modified Example]

In the first and second embodiments described above, refresh is performed due to a refresh writing request. However, the refresh may be performed due to a combination of a plurality of requests. This will be described exemplifying the refresh described in FIG. 5. A scheme in which the refresh is performed due to two requests, which are a read request for reading data from a refresh target page and a write request for writing data obtained by reversing the read data, can be employed. Likewise, in FIG. 7, a scheme in which the refresh is performed due to two requests, which are a request for requesting writing of data, all bits of which are the value "0," and a request for requesting writing of data, all bits of which are the value "1," can be employed. Accordingly, a process of requesting a refresh process can be omitted, and processes of the memory device control unit 310 can be simplified.

[Second Modified Example]

In the above-described embodiments, non-volatile memories to which access is made in units of pages are used, and refresh is performed by managing the number of write operations for each of pages. However, the refresh may be performed by managing the number of write operations in units of blocks constituted by a plurality of pages. For example, writing and refresh can be performed with a page size of 2K bytes and a block size of 128K bytes. Accordingly, a size of data in processes such as writing can be changed in accordance with a size of data stored in the memory 300, and thus system convenience can be improved.

[Third Modified Example]

In the above-described embodiments, the threshold value set when the determination unit 216 or the determination unit 336 determines whether or not refresh is necessary is set as a common value for all areas of the memory 300. However, the determination may be made by dividing the storage areas of the memory 300 and setting different threshold values for the areas. In addition, data having a high frequency of writing and data having a low frequency of writing are stored in different areas and managed. At this time, a smaller threshold value is set for an area in which the data having a low frequency of writing is held than for an area in which the data having a high frequency of writing is held. The reason for this is that, since the data having the low frequency of writing is written at longer time intervals, it is necessary to perform refresh with respect to a smaller number of write operations. Accordingly, the refresh can be performed in accordance with a frequency of data writing, and thus reliability of the system can be enhanced.

[Fourth Modified Example]

In the above-described embodiments, the ECC processing units 213 use the same scheme of the error correction process. However, a configuration with a plurality of schemes of error correction process may be made to replace the schemes with each other when necessary. At this time, a threshold value set at a time of determining whether or not refresh is necessary can be changed in accordance with an error correction capability of an error correction process to be used. For example, when a scheme with a high error correction capability is used, the threshold value is changed to have a greater value. It is because, even if corruption of data occurs in a memory cell due to lengthening intervals of refresh execution, an error of read data can be corrected through an error correction process with a high error correction capability. Accordingly, the number of write operations resulting from refresh can be reduced, and thus system reliability can be improved.

According to the embodiments of the present technology described above, refresh can be performed without saving data, and corruption of data in non-volatile memories can be prevented.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disk), a memory card, and a Blu-ray disc (registered trademark) can be used.

In addition, the effects described in the present specification are not limiting but are merely examples, and there may be other effects.

Additionally, the present technology may also be configured as below.

(1)

A memory controller including:

a number-of-write-operations information holding unit configured to hold number-of-write-operations information, which is the number of write operations of a non-volatile memory to which access is made in units of pages which are divided by a page size;

a determination unit configured to determine whether or not refresh, which is reversing of values of all memory cells constituting the pages, is necessary on the basis of the held number-of-write-operations information; and a write control unit configured to further perform the refresh in addition to writing when the refresh is necessary on the basis of a result of the determination at a time of the writing with respect to the pages.

(2)

The memory controller according to (1), wherein the number-of-write-operations information holding unit holds the number-of-write-operations information for each of the pages.

(3)

The memory controller according to (1), wherein the number-of-write-operations information holding unit holds the number-of-write-operations information for each of blocks, which are constituted by a plurality of pages.

(4)

The memory controller according to any of (1) to (3), wherein the determination unit determines that the refresh is necessary when the held number-of-write-operations information is greater than a predetermined threshold value.

(5)

The memory controller according to any of (1) to (4), wherein the write control unit performs the refresh by reading data stored in the pages and writing data obtained by reversing values of bits of the read data on the pages.

(6)

The memory controller according to any of (1) to (4), wherein the write control unit performs the refresh by writing first data of a page size of which all bits have the same value and second data obtained by reversing all of the bits of the first data on the pages in order.

(7)

The memory controller according to any of (1) to (6), further including:

a counter unit configured to perform counting of the number of write operations, update the held number-of-write-operations information with the number of write operations based on the counting when the write control unit performs the writing that does not entail the refresh, and initialize the held number-of-write-operations information when the write control unit performs the writing that entails the refresh.

(8)

The memory controller according to (7), further including:

a cumulative number-of-write-operations information holding unit configured to hold cumulative number-of-write-operations information, which is the cumulative number of write operations of each of the pages;

a data replacement control unit configured to control replacement of data in which, on the basis of the held cumulative number-of-write-operations information, data read from one page of a page whose cumulative number of write operations is great and a page whose cumulative number of write operations is small is written on the other page; and a cumulative counter unit configured to perform counting of the cumulative number of write operations, and update the held cumulative number-of-write-operations information with the cumulative number of write operations based on the counting, wherein the determination unit further makes determination of whether or not the refresh is necessary at a time of the replacement of data.

(9)

A storage device including:

a non-volatile memory to which access is made in units of pages which are divided by a page size;

a number-of-write-operations information holding unit configured to hold number-of-write-operations information, which is the number of write operations of the non-volatile memory;

a determination unit configured to determine whether or not refresh, which is reversing of values of all memory cells constituting the pages, is necessary on the basis of the held number-of-write-operations information; and a write control unit configured to further perform the refresh in addition to writing when the refresh is necessary on the basis of a result of the determination at a time of the writing with respect to the pages.

(10)

An information processing system including:

a storage device including a non-volatile memory to which access is made in units of pages which are divided by a page size, a number-of-write-operations information holding unit configured to hold number-of-write-operations information, which is the number of write operations of the non-volatile memory, a determination unit configured to determine whether or not refresh, which is reversing of values of all memory cells constituting the pages, is necessary on the basis of the held number-of-write-operations information, and a write control unit configured to further perform the refresh in addition to writing when the refresh is necessary on the basis of a result of the determination at a time of the writing with respect to the pages; and a host computer which accesses the storage device.

(10)

A memory controlling method including:

a determination procedure of determining, on the basis of number-of-write-operations information, which is the number of write operations of a non-volatile memory to which access is made in units of pages which are divided by a page size, whether or not refresh, which is reversing of values of all memory cells constituting the pages, is necessary; and a write control procedure of further performing the refresh in addition to writing when the refresh is necessary on the basis of a result of the determination at a time of the writing with respect to the pages.

REFERENCE SIGNS LIST 100 host computer
109, 309 memory controller interface
110 processor
200 memory controller
208 memory interface
209 host interface
210 control unit
211 read control unit
212, 332 write control unit
213 ECC processing unit
214 number-of-write-operations information holding unit
215, 335 counter unit
216, 336 determination unit
217 wear leveling control unit
218 cumulative number-of-write-operations information holding unit
219 cumulative counter unit
300 memory
310 memory device control unit
320, 340 memory cell array
321 memory element
322 MOSFET 323 memory cell
330 memory device control unit
343 data area
344 number-of-write-operations information holding area

The invention claimed is:

1. A memory controller comprising:
   a number-of-write-operations information holding unit configured to hold number-of-write-operations information, which is a number of write operations of a non-volatile memory to which access is made in units of pages which are divided by a page size;
   a determination unit configured to determine whether or not refresh, which is reversing of values of all memory cells constituting the pages, is necessary based on the held number-of-write-operations information; and
   a write control unit configured to further perform the refresh in addition to writing when the refresh is necessary based on a result of the determination at a time of the writing with respect to the pages.

2. The memory controller according to claim 1, wherein the number-of-write-operations information holding unit holds the number-of-write-operations information for each of the pages.

3. The memory controller according to claim 1, wherein the number-of-write-operations information holding unit holds the number-of-write-operations information for each of blocks, which are constituted by a plurality of pages.

4. The memory controller according to claim 1, wherein the determination unit determines that the refresh is necessary when the held number-of-write-operations information is greater than a predetermined threshold value.

5. The memory controller according to claim 1, wherein the write control unit performs the refresh by reading data stored in the pages and writing data obtained by reversing values of bits of the read data on the pages.

6. The memory controller according to claim 1, wherein the write control unit performs the refresh by writing first data of a page size of which all bits have a same value and second data obtained by reversing all of the bits of the first data on the pages in order.

7. The memory controller according to claim 1, further comprising:
   a counter unit configured to perform counting of the number of write operations, update the held number-of-write-operations information with the number of write operations based on the counting when the write control unit performs the writing that does not entail the refresh, and initialize the held number-of-write-operations information when the write control unit performs the writing that entails the refresh.

8. The memory controller according to claim 7, further comprising:
   a cumulative number-of-write-operations information holding unit configured to hold cumulative number-of-write-operations information, which is a cumulative number of write operations of each of the pages;
   a data replacement control unit configured to control replacement of data in which, based on the held cumulative number-of-write-operations information, data read from one page of a first page whose cumulative number of write operations is greater than a first threshold value or a second page whose cumulative number of write operations is smaller than a second threshold value is written on another page; and
   a cumulative counter unit configured to perform counting of the cumulative number of write operations, and update the held cumulative number-of-write-operations information with the cumulative number of write operations based on the counting,
   wherein the determination unit further makes determination of whether or not the refresh is necessary at a time of the replacement of data.

9. A storage device, comprising:
   a non-volatile memory to which access is made in units of pages which are divided by a page size;
   a number-of-write-operations information holding unit configured to hold number-of-write-operations information, which is a number of write operations of the non-volatile memory;
   a determination unit configured to determine whether or not refresh, which is reversing of values of all memory cells constituting the pages, is necessary based on the held number-of-write-operations information; and
   a write control unit configured to further perform the refresh in addition to writing when the refresh is necessary based on a result of the determination at a time of the writing with respect to the pages.

10. An information processing system comprising:
    a storage device including
        a non-volatile memory to which access is made in units of pages which are divided by a page size,
        a number-of-write-operations information holding unit configured to hold number-of-write-operations information, which is a number of write operations of the non-volatile memory,
        a determination unit configured to determine whether or not refresh, which is reversing of values of all memory cells constituting the pages, is necessary based on the held number-of-write-operations information, and
        a write control unit configured to further perform the refresh in addition to writing when the refresh is necessary based on a result of the determination at a time of the writing with respect to the pages; and
    a host computer which accesses the storage device.

11. A memory controlling method, comprising:
    a determination procedure of determining, based on number-of-write-operations information, which is a number of write operations of a non-volatile memory to which access is made in units of pages which are divided by a page size, whether or not refresh, which is reversing of values of all memory cells constituting the pages, is necessary; and
    a write control procedure of further performing the refresh in addition to writing when the refresh is necessary based on a result of the determination at a time of the writing with respect to the pages.

* * * * *